United States Patent
Koo et al.

(10) Patent No.: US 9,337,272 B2
(45) Date of Patent: May 10, 2016

(54) FERROMAGNET-FREE SPIN TRANSISTOR AND METHOD FOR OPERATING THE SAME

(71) Applicant: Korea Institute of Science and Technology, Seoul (KR)

(72) Inventors: Hyun Cheol Koo, Seoul (KR); Hyung-jun Kim, Seoul (KR); Joonyeon Chang, Seoul (KR); Won Young Choi, Seoul (KR); Suk Hee Han, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 14/508,404

(22) Filed: Oct. 7, 2014

(65) Prior Publication Data

US 2015/0333123 A1 Nov. 19, 2015

(30) Foreign Application Priority Data

May 14, 2014 (KR) .................. 10-2014-0057853

(51) Int. Cl.
*H01L 29/06* (2006.01)
*H01L 29/12* (2006.01)
*H01L 29/82* (2006.01)
*H01L 29/205* (2006.01)
*H01L 29/16* (2006.01)

(52) U.S. Cl.
CPC .......... *H01L 29/122* (2013.01); *H01L 29/0669* (2013.01); *H01L 29/1606* (2013.01); *H01L 29/205* (2013.01); *H01L 29/82* (2013.01)

(58) Field of Classification Search
None
See application file for complete search history.

(56) References Cited

U.S. PATENT DOCUMENTS

| 7,602,636 B2 | 10/2009 | Saito et al. |
| 8,058,676 B2 | 11/2011 | Kim et al. |
| 8,295,006 B2 | 10/2012 | Sugano et al. |
| 2008/0157062 A1 | 7/2008 | Asatani |
| 2011/0279146 A1* | 11/2011 | Koo ............ B82Y 10/00 326/100 |

FOREIGN PATENT DOCUMENTS

| JP | 2008-66596 A | 3/2008 |
| JP | 2008-160993 A | 7/2008 |
| JP | 2008-166559 A | 7/2008 |
| JP | 2010-3850 A | 1/2010 |
| JP | 4934582 B2 | 2/2012 |
| KR | 10-2010-0028727 A | 3/2010 |
| KR | 10-2010-0037683 A | 4/2010 |
| KR | 10-1084019 B1 | 11/2011 |
| KR | 10-2013-0063236 A | 6/2013 |

OTHER PUBLICATIONS

Brüne, Christoph, et al. "Spin polarization of the quantum spin Hall edge states." arXiv preprint arXiv:1107.0585v2, 2011 (27 pages).

* cited by examiner

*Primary Examiner* — Daniel Whalen
(74) *Attorney, Agent, or Firm* — NSIP Law

(57) ABSTRACT

A spin transistor includes: an input part that is made of a material exhibiting a spin Hall effect and configured to transfer electrons with a predetermined direction of spin to a connecting part; and the connecting part that receives the electrons with the predetermined direction of spin from the input part, rotates the spin of the electrons in accordance with a gate voltage applied to the gate electrode, and transfers the electrons to the output part.

10 Claims, 5 Drawing Sheets

FIG. 5

| Vg | V1 | V2 | V3 | V4 |
|---|---|---|---|---|
| Vh | 0 | V+ | 0 | V- |
| Switch | OFF | ON | OFF | ON |

FERROMAGNET-FREE SPIN TRANSISTOR AND METHOD FOR OPERATING THE SAME

CROSS-REFERENCE TO RELATED APPLICATION

This application claims priority to and the benefit of Korean Patent Application No. 10-2014-0057853 filed in the Korean Intellectual Property Office on May 14, 2014, the entire contents of which are incorporated herein by reference.

BACKGROUND OF THE INVENTION (a) Field of the Invention

The present invention relates to a ferromagnet-free spin transistor. More particularly, the present invention relates to a spin transistor which can be operated without a ferromagnet, unlike a usual spin transistor.

(b) Description of the Related Art

In recent years, research exploiting the intrinsic spin of the electron, in addition to its fundamental electronic charge, has been actively pursued. This technology is called spintronics. A spin transistor, originally proposed by Datta and Das, is a typical spin device, and has been attracting attention as a high-speed, non-volatile, low-power, and highly integrated device. A great deal of research on spin transistor-based logic devices is currently underway.

In order to operate the spin transistor, it is necessary to inject spins aligned in one direction from a ferromagnet into a semiconductor channel. However, injecting spins in one direction may bring about problems such as a very low spin injection rate during spin injection.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a spin transistor which is operated without a ferromagnet by easily extracting spins of one orientation using the spin Hall effect.

An exemplary embodiment of the present invention provides a spin transistor including: an input part that is made of a material exhibiting a spin Hall effect and configured to transfer electrons with a predetermined direction of spin to a connecting part; and the connecting part that receives the electrons with the predetermined direction of spin from the input part, rotates the spin of the electrons in accordance with a gate voltage applied to the gate electrode, and transfers the electrons to the output part.

The spin transistor may further include an output part that is made of a material exhibiting the spin Hall effect and configured to output a voltage depending on the spin direction of the electrons transferred from the connecting part.

The material exhibiting the spin Hall effect may include a quantum-well layer with an InAs, GaAs, InSb, or InGaAs channel, graphene, nanowire, or a metal/oxide interface.

The spin direction of electrons transferred to the output part may be determined by the gate voltage.

Another embodiment of the present invention provides a spin transistor including: a rectangular connecting part; and an input part that is made of a material exhibiting the spin Hall effect, is connected to one end of the connecting part, and extends in a direction orthogonal to the connecting part.

The spin transistor may further include a rectangular output part that is made of a material exhibiting the spin Hall effect, is connected to the other end of the connecting part, and extends in a direction orthogonal to the connecting part.

The material exhibiting the spin Hall effect may include a quantum-well layer with an InAs, GaAs, InSb, or InGaAs channel, graphene, nanowire, or a metal/oxide interface.

The spin transistor may further include a gate electrode that is connected to the connecting part, the input part, and the output part.

The input part may be configured to transfer electrons with a predetermined direction of spin to the connecting part.

The connecting part may be configured to receive the electrons with the predetermined direction of spin from the input part, rotate the spin of the electrons in accordance with a gate voltage applied to the gate electrode, and transfer the electrons to the output part.

The output part may be configured to output a voltage depending on the spin direction of the electrons transferred from the connecting part.

The spin direction of electrons transferred to the output part may be determined by the gate voltage.

According to the present invention, the process of injecting spins of one orientation to a ferromagnet can be omitted, and a spin transistor can be operated without a ferromagnet. This contributes to reducing the waste of time caused by contact resistance and any losses during spin injection.

BRIEF DESCRIPTION OF THE DRAWINGS

FIG. 5 illustrates a table representing the correspondence relationship among the gate voltage, the output voltage of the spin transistor of the present invention, and the switch of the spin transistor.

DETAILED DESCRIPTION OF THE EMBODIMENTS

Figure 1:
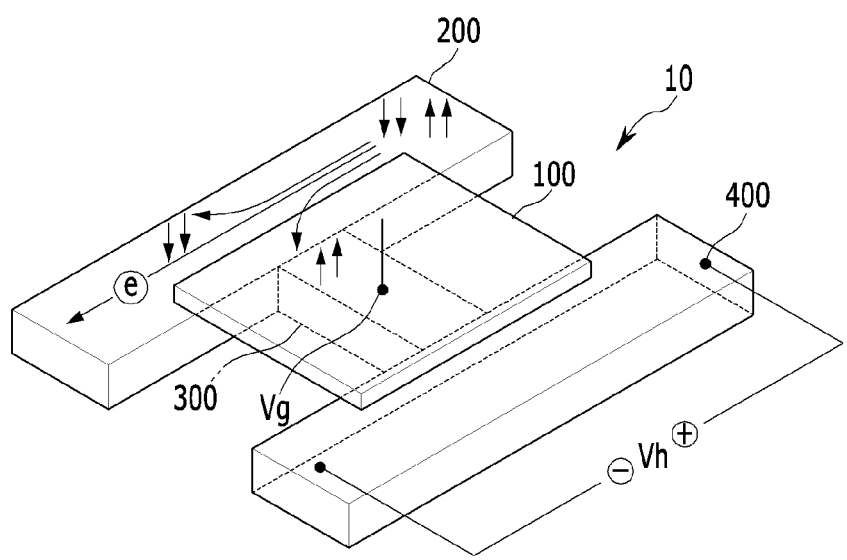
FIG. 1 is a perspective view of a spin transistor according to an exemplary embodiment of the present invention.

It is understood that when an element is referred hereinabove as being "on" another element, it can be directly on the other element or intervening elements may be present therebetween. In contrast, when an element is referred to as being "directly on" another element, there are no intervening elements present.

It is further understood that, although ordinal terms such as "first," "second," and "third" are used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a "first element," "component," "region," "layer," or "section" discussed below could be termed a second element, component, region, layer, or section without departing from the teachings herein.

The terminology used herein is only for the purpose of describing particular embodiments, and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including" (and variants thereof), when used herein, specify the presence of stated features, integers, steps, operations, elements, and/or components, but do not preclude the presence or addition of one or more other features, integers, steps, operations, elements, components, and/or groups thereof.

Spatially relative terms, such as "below," "under", "lower," "above," "over", "upper," and the like may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "under" other elements or features would then be oriented "above" or "over" the other elements or features. Thus, the example terms "below" can encompass both positions and orientations of above and below. The device may be otherwise oriented (rotated 90 degrees or other orientations), and the spatially relative descriptors used herein are to be interpreted accordingly.

Unless otherwise defined, all terms (including technical and scientific terms) used herein have the same meaning as commonly understood by one of ordinary skill in the art to which this invention belongs. It will be further understood that terms such as those defined in commonly used dictionaries should be interpreted as having a meaning that is consistent with their meaning in the context of the relevant art and will not be interpreted in an idealized or overly formal sense unless expressly so defined herein.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 2:
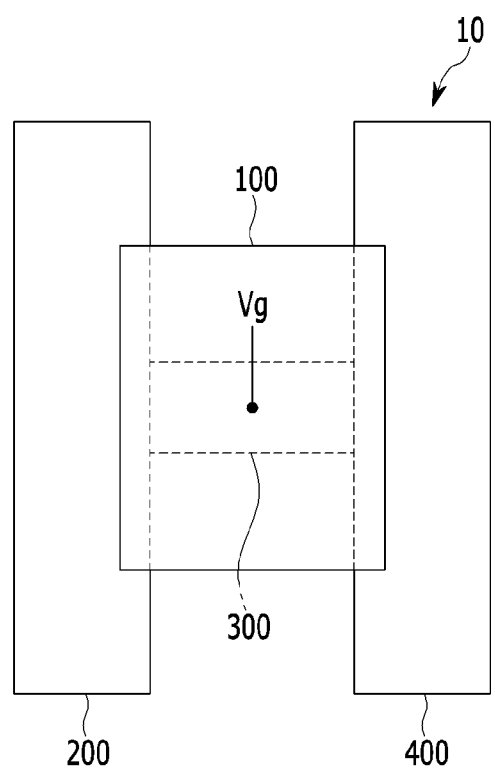
FIG. 2 is a view of the spin transistor according to an exemplary embodiment of the present invention as viewed from above.

FIG. 1 is a perspective view of a spin transistor 10 according to an exemplary embodiment of the present invention. FIG. 2 is a view of the spin transistor 10 according to an exemplary embodiment of the present invention as viewed from above.

Referring to FIGS. 1 and 2, the spin transistor 10 according to the present invention includes a gate electrode 100, an input part 200, a connecting part 300, and an output part 400.

The gate electrode 100 controls the spin rotation of electrons in accordance with a gate voltage Vg applied to the gate electrode 100.

That is, the spin speed of electrons varies with the gate voltage Vg applied to the gate electrode 100. Thus, assuming that the length of the connecting part 300 through which electrons move is predetermined, it is clear that, if electrons transferred to the input part 300 move through the connecting part 300 as they spin, the spin direction of electrons arriving at the output part 400 will be determined by the gate voltage Vg applied to the gate electrode 100.

Specifically, electrons injected into the connecting part 300 spin (precession) through the Rashba effect. The electrons spin clockwise or counterclockwise depending on their movement direction.

In the exemplary embodiment of the present invention, electrons move from left to right (from the input part to the output part), so the electrons will be described as spinning clockwise, but the present invention is not limited thereto.

That is, the spin direction of electrons moving through the connection part 300 and arriving at the output part 400 is rotated at a predetermined angle from the spin direction (spin-up direction in this exemplary embodiment) of initially transferred electrons in accordance with the gate voltage Vg applied to the gate electrode 100.

The input part 200 is made of a material that exhibits the spin Hall effect, and is configured to transfer electrons with a predetermined direction of spin to the connecting part 300.

The spin Hall effect refers to the accumulation of spin-up electrons and spin-down electrons on opposite sides of an electric current sample in a direction perpendicular to the current.

Specifically, electrons tend to scatter off impurities if any exist. Examples of the spin Hall effect include an extrinsic spin Hall effect induced by the scattering of spin-up electrons and spin-down electrons in opposite directions, and an intrinsic spin Hall effect induced by the intrinsic spin-orbit coupling of an energy band structure if there are no impurities.

Examples of the material exhibiting the spin Hall effect include, but are not limited to, a quantum-well layer with an InAs, GaAs, InSb, or InGaAs channel, graphene, nanowire, and a metal/oxide interface.

More concretely, the input part 200 is made of one of the above-mentioned materials exhibiting the spin Hall effect. Due to the spin Hall effect, when electrons move from one end (the upper end of FIGS. 1 and 2) of the input part 200 to the other end (the lower end of FIGS. 1 and 2), spin-up electrons move in the +x direction (to the left side of the flow of carriers) and spin-down electrons move in the −x direction (to the right side of the flow of carriers).

Consequently, the spin-down electrons move to the opposite side of the connecting part 300. Accordingly, the electrons transferred to the connecting part 300 all consist of spin-up electrons. Although spins are generally injected from a ferromagnet into a semiconductor channel in order to accumulate spin-up electrons, which leads to the problem of very low spin injection rate, the present invention can solve this problem.

While the electrons accumulated at the connecting part 300 according to the present invention have been described as spin-up electrons, the present invention is not necessarily limited to this example, and electrons with a predetermined direction of spin may be accumulated.

The connecting part 300 is configured to receive spin-up electrons, rotate the spin of the electrons in accordance with a voltage applied to the gate electrode 100, and transfer them to the output part 400.

That is, the connecting part 300 serves as a path through which spin-up electrons move to the output part 400 like a semiconductor channel does. The relationship between the movement of electrons in the connecting part 300 and the gate voltage Vg will be described in detail with reference to FIG. 3.

The output part 400 is made of a material exhibiting the spin Hall effect, and is configured to output a voltage depending on the spin direction of electrons transferred from the connecting part 300.

Examples of the material exhibiting the spin Hall effect include, but are not limited to, a quantum-well layer with an InAs, GaAs, InSb, or InGaAs channel, graphene, nanowire, or a metal/oxide interface.

The movement of electrons in the output part 400 will be described in detail with reference to FIG. 4.

Figure 3:
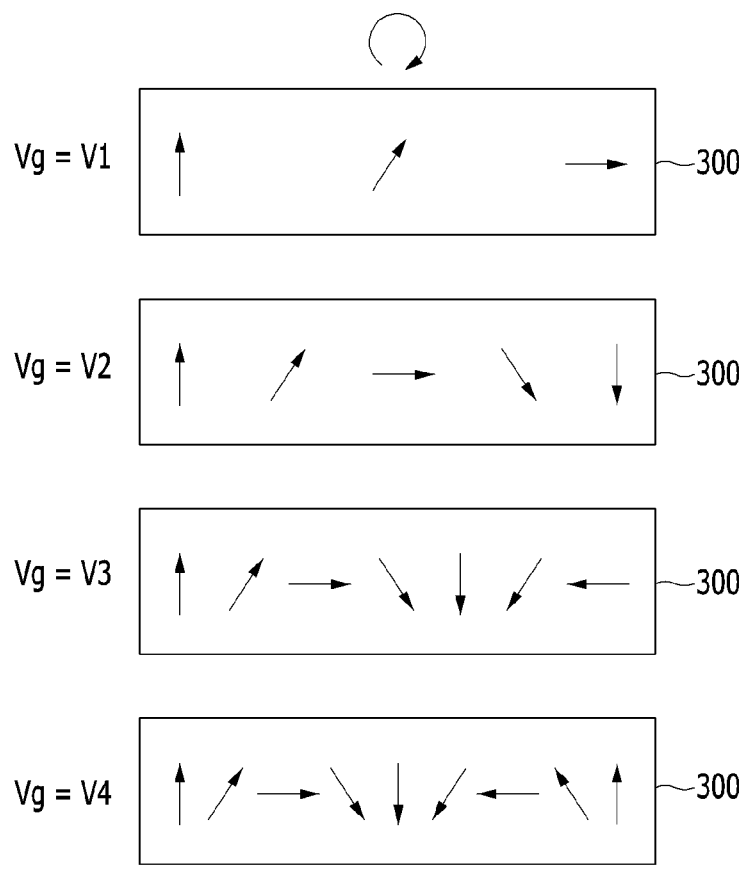
FIG. 3 illustrates the movement of electrons in the connecting part depending on the gate voltage.

FIG. 3 illustrates the movement of electrons in the connecting part 300 depending on the gate voltage Vg.

Referring to FIG. 3, spin-up electrons transferred to one end (on the left edge of FIG. 3) of the connecting part 300 from the input part 200 move to the other end (on the right edge of FIG. 3) of the connecting part 300 as they spin clockwise in accordance with the gate voltage Vg.

For convenience of explanation, it is assumed that, if the spin direction of electrons is rotated by 90 degrees and spin-up electrons are on the other end of the connecting part 300, the gate voltage Vg is a first voltage V1.

Also, it is assumed that, if the spin direction of electrons is rotated by 180 degrees and spin-down electrons are on the other end of the connecting part 300, the gate voltage Vg is a second voltage V2.

Also, it is assumed that, if the spin direction of electrons is rotated by 270 degrees and electrons with the 9 o'clock direction of spin are on the other end of the connecting part 300, the gate voltage Vg is a second voltage V3.

Also, it is assumed that, if the spin direction of electrons is rotated by 270 degrees and electrons with the 3 o'clock direction of spin are on the other end of the connecting part 300, the gate voltage Vg is a second voltage V4.

In this way, the electrons transferred from the input part 200 to the connecting part 300 move to the output part 400 as the spin direction of the electrons is rotated in accordance with the gate voltage Vg applied to the gate electrode 100.

Figure 4:
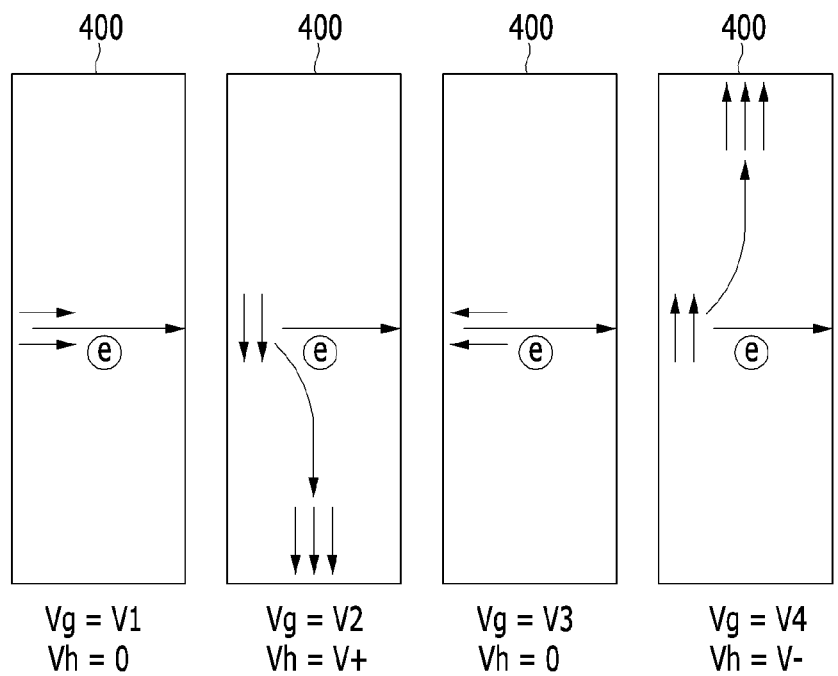
FIG. 4 illustrates the movement of electrons in the output part induced by the spin Hall effect.

FIG. 4 illustrates the movement of electrons in the output part 400 induced by the spin Hall effect.

Referring to FIG. 4, the output part 400 is made of a material exhibiting the spin Hall effect, and is configured to output a voltage depending on the spin direction of electrons transferred from the connecting part 300.

Concretely, the output part 400 is made of a material exhibiting the spin Hall effect. Due to the spin Hall effect, as described above, when electrons transferred from the connecting part 300 move from one end (the left end of FIG. 4) of the output part 400 to the other end (the right end of FIG. 4), spin-up electrons move in the +x direction (to the left side of the flow of carriers) and spin-down electrons move in the −x direction (to the right side of the flow of carriers).

If the gate voltage Vg is the first voltage V1, the electrons transferred to the output part 400 are electrons with the 3 o'clock direction of spin. Thus, the electrons moving from one end to the other end of the output part 400 are not governed by the spin Hall effect and therefore move to the other end of the output part 400 as they are supposed to.

If the gate voltage Vg is the second voltage V2, the electrons transferred to the output part 400 are spin-down electrons. Thus, the electrons moving from one end to the other end of the output part 400 are governed by the spin Hall effect and therefore move downward as shown in FIG. 4 (to the left side of the flow of carriers).

If the gate voltage Vg is the third voltage V3, the electrons transferred to the output part 400 are electrons with the 9 o'clock direction of spin. Thus, the electrons moving from one end to the other end of the output part 400 are not governed by the spin Hall effect and therefore move to the other end of the output part 400 as they are supposed to.

If the gate voltage Vg is the fourth voltage V4, the electrons transferred to the output part 400 are spin-up electrons. Thus, the electrons moving from one end to the other end of the output part 400 are governed by the spin Hall effect and therefore move upward as shown in FIG. 4 (to the right side of the flow of carriers).

Referring back to FIG. 1, if the gate voltage Vg is the first voltage V1 or the fourth voltage V4, the output voltage Vh, i.e., the voltage between both ends along the length of the output part 400, becomes zero (0).

If the gate voltage Vg is the second voltage V2, the output voltage Vh, i.e., the voltage between both ends along the length of the output part 400, becomes positive (V+).

If the gate voltage Vg is the third voltage V3, the output voltage Vh, i.e., the voltage between both ends along the length of the output part 400, becomes negative (V−).

Figure 5:
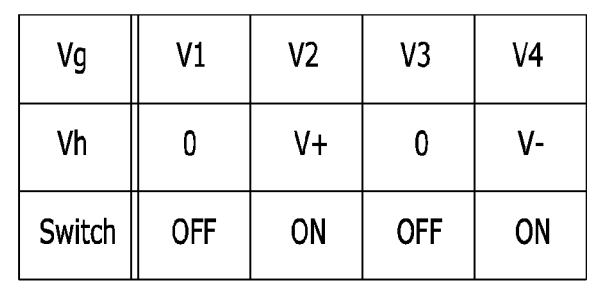

This will be shown in the table of FIG. 5. FIG. 5 illustrates a table representing the correspondence relationship among the gate voltage Vg, the output voltage Vh of the spin transistor 10 of the present invention, and the switch of the spin transistor 10.

Specifically, if Vg is V1 or V3, the spin transistor 10 turns on, and if Vg is V2 or V4, the spin transistor 10 turns off. For example, if V0 is 0 V and V4 is 1 V, the spin transistor 10 turns off at 0 V and turns on at 1 V.

As seen above, the switch of the spin transistor 10 can be turned on and off by adjusting the gate voltage Vg. Therefore, it is clear that the spin transistor 10 according to the present invention functions as a transistor that controls the voltage of the output part 400 using the gate.

While the invention has been shown and described with respect to the preferred embodiments, it will be understood by those skilled in the art that various changes and modifications may be made without departing from the spirit and scope of the invention as defined in the following claims.

DESCRIPTION OF SYMBOLS

10: spin transistor
100: gate electrode
200: input part
300: connecting part
400: output part

What is claimed is:

1. A spin transistor comprising:
a rectangular input part that is made of a material exhibiting a spin Hall effect and configured to transfer, without ferromagnetic material, electrons of a predetermined direction of spin to a rectangular connecting part;
the connecting part that receives the electrons with the predetermined direction of spin from the input part, rotates the spin of the electrons in accordance with a gate voltage applied to a gate electrode, and transfers the electrons to a rectangular output part, and
the output part that is made of a material exhibiting the spin Hall effect and configured to output a voltage depending on the spin direction of the electrons transferred from the connecting part,
wherein the input part is connected to one end of the connecting part, extends the length of the rectangle in a direction orthogonal to a length direction of the connecting part, and extends the width of the rectangle in a direction parallel to the length direction of the connecting part,
wherein the output part is connected to the other end of the connecting part, and extends the length of the rectangle in a direction orthogonal to a length direction of the connecting part, and extends the width of the rectangle in a direction parallel to the length direction of the connecting part,
wherein the input part, the connecting part, and the output part are integrally formed in a shape of H.

2. The spin transistor of claim 1, wherein the material exhibiting the spin Hall effect is a quantum well-layer with a channel of InAs, GaAs, InSb, or InGaAs; a graphene; a nanowire; or a metal/oxide interface.

3. The spin transistor of claim 2, wherein the spin direction of electrons transferred to the output part is determined by the gate voltage.

4. A spin transistor comprising:
a rectangular connecting part;
a rectangular input part that is made of a material exhibiting the spin Hall effect, is connected to one end of the connecting part, extends the length of the rectangle in a direction orthogonal to a length direction of the connecting part, and extends the width of the rectangle in a direction parallel to the length direction of the connecting part, and
a rectangular output part that is made of a material exhibiting the spin Hall effect, is connected to the other end of the connecting part, and extends the length of the rectangle in a direction orthogonal to a length direction of the connecting part, and extends the width of the rectangle in a direction parallel to the length direction of the connecting part,
wherein the input part, the connecting part, and the output part are integrally formed in a shape of H.

5. The spin transistor of claim 4, wherein the material exhibiting the spin Hall effect is a quantum well-layer with a channel of InAs, GaAs, InSb, or InGaAs; a graphene; a nanowire; or a metal/oxide interface.

6. The spin transistor of claim 5, further comprising a gate electrode that is connected to the connecting part, the input part, and the output part.

7. The spin transistor of claim 6, wherein the input part is configured to transfer electrons with a predetermined direction of spin to the connecting part.

8. The spin transistor of claim 7, wherein the connecting part is configured to receive the electrons with the predetermined direction of spin from the input part, rotate the spin of the electrons in accordance with a gate voltage applied to the gate electrode, and transfer the electrons to the output part.

9. The spin transistor of claim 8, wherein the output part is configured to output a voltage depending on the spin direction of the electrons transferred from the connecting part.

10. The spin transistor of claim 9, wherein the spin direction of electrons transferred to the output part is determined by the gate voltage.

\* \* \* \* \*